(12) United States Patent
Nam

(10) Patent No.: US 8,004,034 B2
(45) Date of Patent: Aug. 23, 2011

(54) SINGLE POLY TYPE EEPROM AND METHOD FOR MANUFACTURING THE EEPROM

(75) Inventor: Sang-Woo Nam, Cheongju-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 213 days.

(21) Appl. No.: 12/344,495

(22) Filed: Dec. 27, 2008

(65) Prior Publication Data
US 2009/0194806 A1 Aug. 6, 2009

(30) Foreign Application Priority Data
Dec. 27, 2007 (KR) .................. 10-2007-0138323

(51) Int. Cl.
 H01L 29/788 (2006.01)
 H01L 21/336 (2006.01)
 H01L 21/02 (2006.01)
(52) U.S. Cl. ............... 257/322; 257/319; 257/E29.3; 257/E21.422; 257/E21.008; 257/E21.409; 438/283; 438/381; 438/585
(58) Field of Classification Search .............. 257/322, 257/315, 319, E29.3, E21.422, E21.008, 257/E21.409; 438/585, 381, 283, 259, 257, 438/264; 365/185.17
See application file for complete search history.

(56) References Cited

U.S. PATENT DOCUMENTS

| 6,842,372 | B1 | 1/2005 | Hu | |
|---|---|---|---|---|
| 2005/0006697 | A1* | 1/2005 | Hsieh | ............................ 257/317 |
| 2006/0203552 | A1* | 9/2006 | Chen et al. | ............... 365/185.17 |

FOREIGN PATENT DOCUMENTS

| CN | 1380699 | 11/2002 |
|---|---|---|
| CN | 1681128 | 10/2005 |

* cited by examiner

*Primary Examiner* — Victor Mandala
*Assistant Examiner* — Whitney Moore
(74) *Attorney, Agent, or Firm* — Sherr & Vaughn, PLLC

(57) ABSTRACT

Embodiments relate to a single poly type EEPROM and a method for manufacturing an EEPROM. According to embodiments, a single poly type EEPROM may include unit cells. A unit cell may include a floating gate at a side of a control node formed on and/or over a semiconductor substrate having an activation region and a device isolation area, not overlapping a device isolation region but overlapping only a top of the activation region. A select gate may be formed on and/or over a top of the activation region. According to embodiments, a ratio of a capacitance of a control node side to a capacitance of a bit line side may increase, which may improve a coupling ratio. According to embodiments, a junction capacitance may be maximized by not doping the floating gate with an impurity, which may allow for a reduction in chip size by securing design margins.

9 Claims, 4 Drawing Sheets

SINGLE POLY TYPE EEPROM AND METHOD FOR MANUFACTURING THE EEPROM

Figure 1:
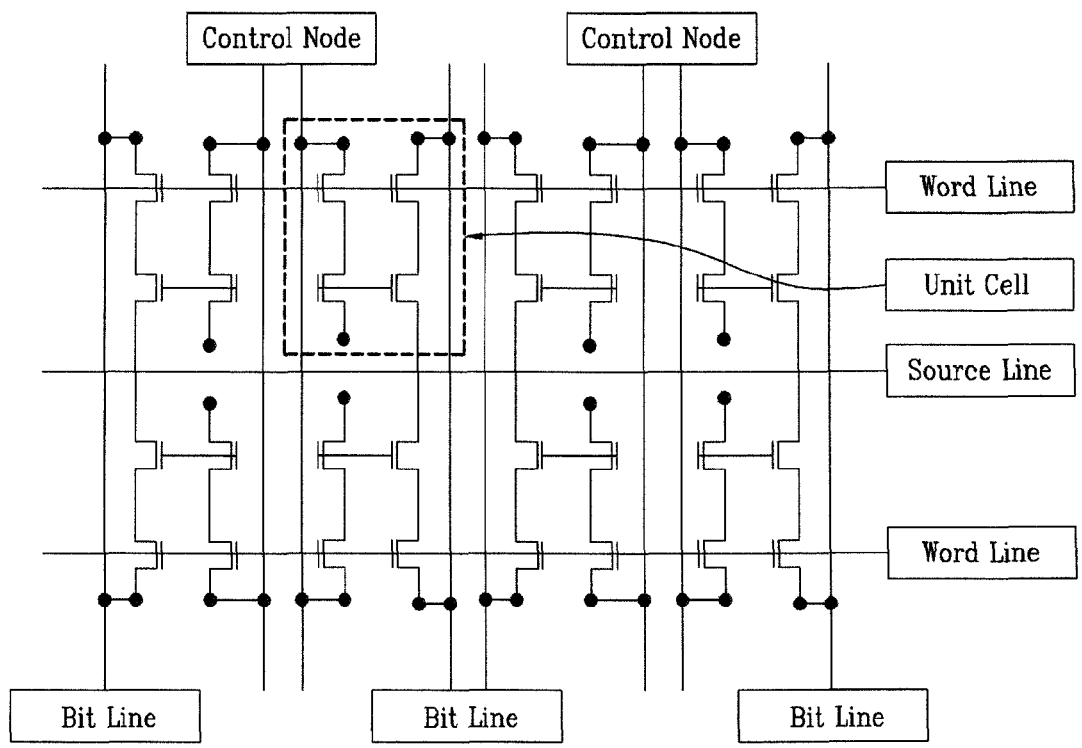

The present application claims priority under 35 U.S.C. 119 to Korean Patent Application No. 10-2007-0138323 (filed on Dec. 27, 2007), which is hereby incorporated by reference in its entirety.

BACKGROUND

A non volatile memory may be classified into various categories. For example a single poly EEPROM may have a poly silicon layer that may function as a gate and may be formed in a single layer. A stack gate (ETOX) may include two poly silicon layers that may be vertically stacked. A dual poly EEPROM may correspond to an intermediate of a single poly EEPROM and stack gate, a split gate, and the like.

A stack gate may have a smallest cell size and relatively complicated circuits. A stack gate may be suitable for high density and high performance, but may not be suitable for low density. An EEPROM may be used for low density. By way of example, a single poly EEPROM may be manufactured by adding approximately two mask processes during a logic process.

In a single poly type EEPROM, a ratio of a voltage applied to a floating gate to a voltage applied to a select gate may refer to a coupling ratio. As a coupling ratio increases, efficiency of programs may increase. Various methods to improve a coupling ratio have been proposed.

For example, as one method for improving a coupling ratio of a single poly EEPROM, a capacitance region may be doped with an impurity. That is, a bottom of a floating gate may be doped with an N type impurity ion. This method, however, may complicate a manufacturing process of an EEPROM, and a size of a unit cell may not be small. This may result in a problem that an entire size of an EEPROM may increase.

SUMMARY

Embodiments relate to a semiconductor device such as an non volatile memory. Embodiments relate to a single poly type EEPROM that may be suitable for a multi-time programmable (MTP) usage and the like, and a method for manufacturing an EEPROM.

Embodiments relate to a single poly type EEPROM that may improve a capacitance of a floating gate side as compared to a capacitance of a bit line side, and that may reduce a chip size by securing a sufficient coupling ratio, and a method for manufacturing a EEPROM.

According to embodiments, a single poly type EEPROM may have has unit cells, which may include at least one of the following. A floating gate at side of a control node formed on and/or over a semiconductor substrate defined as an activation region and a device isolation area, not overlapping with the device isolation region but overlapping with only a top of an activation region. A select gate formed on and/or over the top of the activation region.

According to embodiments, a method for manufacturing a single poly type EEPROM may include at least one of the following. Forming a poly silicon layer on and/or over a semiconductor substrate defined as a activation region and a device isolation region. Forming a floating gate at a side of a control node by patterning the poly silicon layer through photo and etching processes, where the floating gate does not overlap the device isolation region but may overlap only a top of the activation region.

DRAWINGS

Example FIG. 1 is a circuit view of a general cell array of a single poly type EEPROM.

Figure 2:
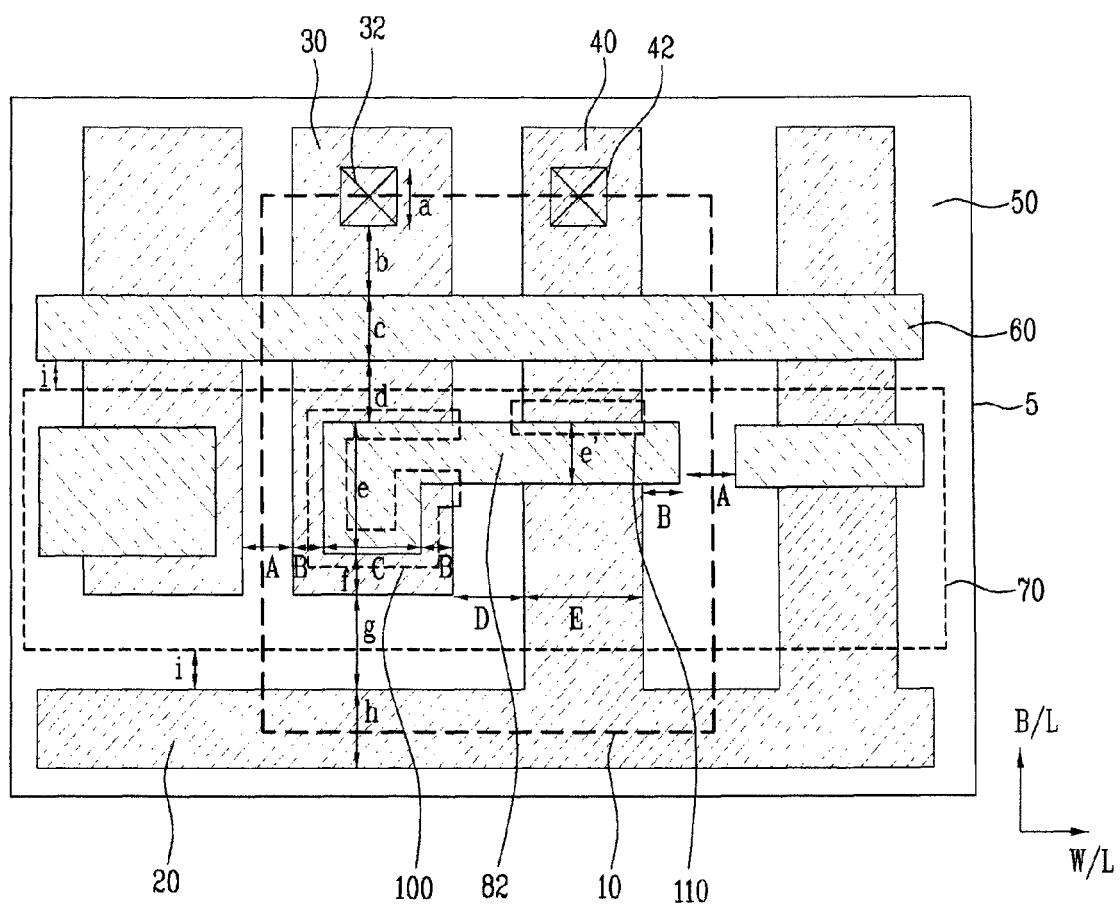

Example FIG. 2 is a drawing illustrating a lay-out of a unit cell of a single poly type EEPROM, according to embodiments.

Figure 3:
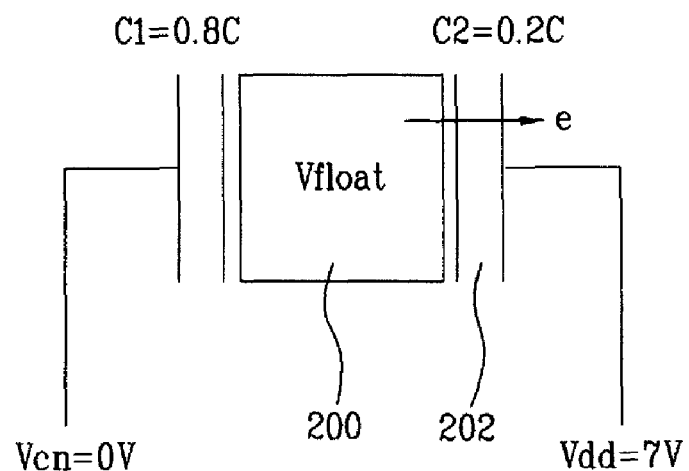

Example FIG. 3 is a schematic drawing illustrating an erase operation of a single poly type EEPROM, according to embodiments.

Figure 4:
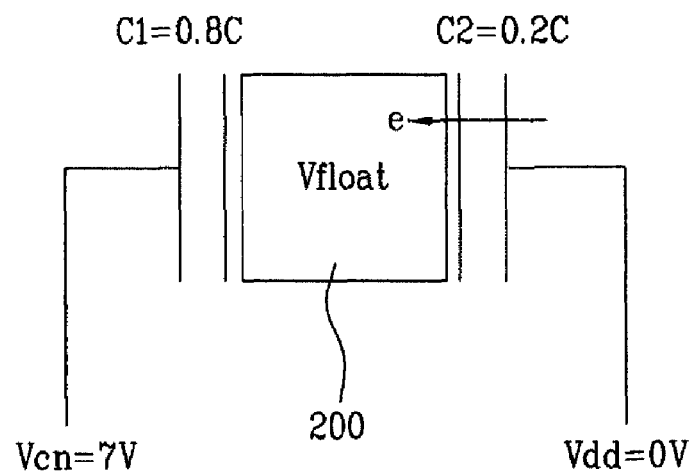

Example FIG. 4 is a schematic drawing illustrating a programming operation of a single poly type EEPROM, according to embodiments.

Figure 5:
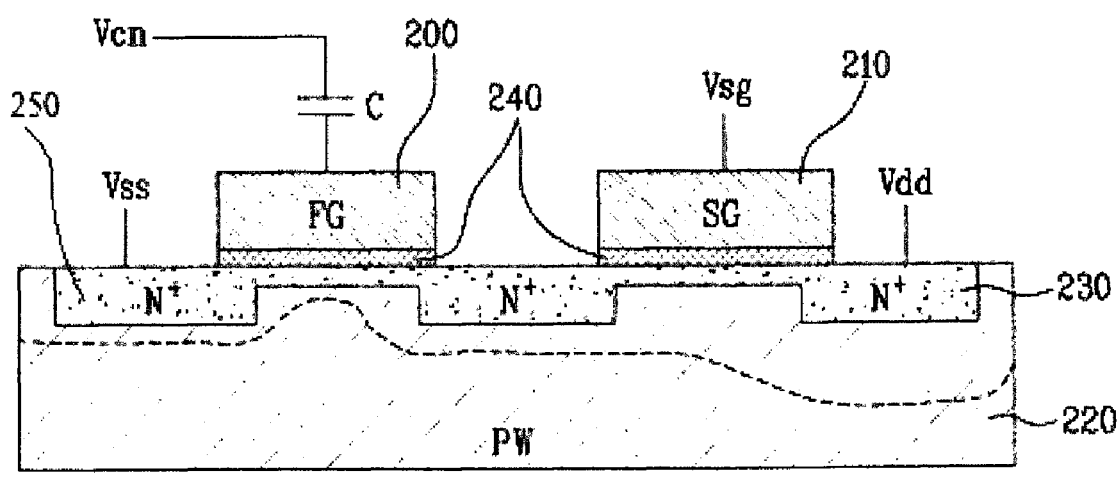

Example FIG. 5 is a cross-sectional view of an EEPROM illustrating a programming using a hot electron injection method, according to embodiments.

DESCRIPTION

Example FIG. 1 is a circuit view of a general cell array of a single poly type EEPROM. Referring to example FIG. 1, a cell array may have a structure where a plurality of unit cells may be repeated. Word lines may be perpendicular to bit lines. Control nodes may be connected to control voltage Vcn. Source lines may be connected to source voltage Vss. Word lines may be connected to select voltage Vsg. Bit lines may be connected to drain voltage Vdd.

Since a cell array shown in example FIG. 1 may have a shape where unit cells may be repeated, a unit cell of a device of embodiments will be described with reference to the drawings.

Example FIG. 2 illustrates a lay-out of a unit cell of a device, according to embodiments. Referring to example FIG. 2, a semiconductor substrate may be defined to have an activation region and a device isolation region. According to embodiments, well 5 may be formed in the semiconductor substrate. Activation regions 20, 30 and 40 may be defined by device isolation film 50, which may be implemented by a commonly thin shallow trench isolation (STI) film.

An activation region may extend from activation regions 20, 30 and 40 shown in example FIG. 2 in word line WL direction. Active region 20 may correspond to source line 20, and may be formed integrally with activation region 40, which may correspond to bit line 40. Drain voltage Vdd may be connected through contact 42 of bit line 40. According to embodiments, activation region 30 may correspond to control node 30, and may have contact 32 connected to control voltage Vcn. According to embodiments, in unit cell 10, source line 20 may be formed in a word line direction, and control node 30 and bit line 40 may be formed in parallel in a bit line direction.

According to embodiments, word line 60 may be extended, and may be long in a word line direction to be formed as select gate 60. Select gate 60 may be extended on and/or over device isolation region 50 and a top of activation regions 30 and 40 in a word line direction, and may alternatively cross device isolation region 50 and activation regions 30 and 40.

Floating gates 80 and 82 may be formed in a word line direction, and may be parallel to select gate 60 in a bit line direction. Floating gate 82 of control node side 30 may not overlap with device isolation region 50 but may overlap a top of activation region 30. In the related art, a floating gate of control node side 30 may have overlapped with both a top of activation region 30 and also a top of device isolation region 50. In other words, different from embodiments illustrated in example FIG. 2, a related art floating gate may have projected more in a left word line direction and may overlap with device isolation region 50. Additionally, a related art floating gate may project more in a lower bit line direction and may overlap with device isolation region 50. That is, intervals B and f may have minus (−) values. According to embodiments, however, floating gate 82 at a side of control node 30 may not overlap with device isolation region 50 and may overlap with activation region 30.

Based on unit cell 10, intervals between the respective layers in a lay-out according to embodiments and illustrated in example in FIG. 2 may be implemented as shown in Table 1.

TABLE 1

| | | Symbol | | | | | | | |
|---|---|---|---|---|---|---|---|---|---|
| | | A | B | C | D | E | | | |
| X axis [μm] | sum | 3.58 | 0.25 | 0.32 | 1.2 | 0.57 | 0.6 | | |
| | | Symbol | | | | | | | |
| | | a | b | c | d | e | f | g | h | e' |
| Y axis [μm] | sum | 2.685 | 0.16 | 0.16 | 0.35 | 0.4 | 0.8 | 0.32 | 0.4 | 0.35 | 0.4 |

According to embodiments, X axis may represent a word line direction and Y axis may represent a bit line direction, respectively. According to embodiments, an area of unit cell may be approximately 9.61 μm², and interval i between select gate 60 and non-salicide region 70 or interval i between source line 20 and non-salicide region 70 may be approximately 0.2 μm. Referring to example FIG. 1, interval B, which may represent a distance that floating gate 82 at a side of control node 30 may be spaced from device isolation region 50 in a word line direction, may be approximately 0.1 μm to 1.0 μm. According to embodiments, interval B may be approximately 0.32 μm. According to embodiments, interval f, which may represent a distance that floating gate 82 at a side of control node 30 may be spaced from device isolation region 50 in a word line direction, may be approximately 0.1 μm to 1.0 μm. According to embodiments, interval f may be approximately 0.32 μm. According to embodiments, distance B that floating gate 82 at a side of control node 30 may be spaced from device isolation region 50 in a word line direction may be substantially the same as distance f that floating gate 82 at a side of control node 30 may be spaced from device isolation region 50 in a bit line direction.

According to embodiments, based on floating gate 82, junction capacitor C1 may be formed in region 100 at a side of a control node, and may be larger than junction capacitor C2, which may be formed on region 110 of a bit line side. According to embodiments, to make a capacitance of junction capacitor C1 larger than that of junction capacitor C2, floating gate 82 may be formed to have a finger form. According to embodiments, a capacitance of floating gate 82 having a finger form may increase. A method for manufacturing a capacitor in a finger form may be known, and a description thereof will be omitted herein.

Programming and erase operations of a device of embodiments will be described with reference to the accompanying drawings. An erase operation will first be described.

Example FIG. 3 is a schematic view illustrating an erase operation of a single poly type EEPROM, according to embodiments. According to embodiments, floating gate 200 may correspond to floating gate 82 shown in example FIG. 2. According to embodiments, a ratio of a capacitance of junction capacitor C1 to that of junction capacitor C2 shown in example FIG. 2 may be approximately 0.2:0.8. According to embodiments, other ratios could be used.

During an erase operation, an electron e, which may be stored in floating gate 200, may be emitted. According to embodiments, a threshold voltage of a cell transistor may lower to a previous threshold voltage. According to embodiments, in a selected cell transistor, approximately a 7V drain voltage Vdd may be applied to bit line 40, approximately a 7V control voltage Vcn may be applied to control node 30, approximately a 7V select voltage Vsg may be applied to select gate 60, and approximately a 0V source voltage Vss may be applied to source line 20. According to embodiments, voltage Vfloat of floating gate 200 may become approximately 1.4V. Hence, voltage difference Vfloat-Vdd of approximately −5.6V may occur between a junction. According to embodiments, this my cause a tunneling phenomenon of electron e through tunnel oxide film 202. This phenomenon may refer to a Flower-Nordheim (FN) tunneling method. According to embodiments, electrons e may be isolated in floating gate 200 and may be emitted to a source or a channel through tunnel oxide film 202.

According to embodiments, a single poly type EEPROM may perform programming using an FN tunneling method. According to embodiments, a single poly type EEPROM may perform programming using a hot electron injection (HEI) method.

A programming operation according to an FN tunneling method will be described with reference to example FIG. 4. Example FIG. 4 is a schematic view illustrating a programming operation of a device, according to embodiments. According to embodiments, floating gate 200 may correspond to floating gate 82 shown in example FIG. 2. According to embodiments, a ratio of the capacitance of junction capacitor C1 to that of junction capacitor C2 shown in example FIG. 2 may range from approximately 0.05 to 0.6:0.95 to 0.4. According to embodiments, a ratio of the capacitance of junction capacitor C1 to that of junction capacitor C2 shown in example FIG. 2 may be approximately 0.2:0.8. According to embodiments, other ratios may exist.

According to embodiments, in an FN tunneling method for performing a programming operation, a same positive voltage may be applied to select gate 60 and control node 30, and a reference voltage, for example, ground voltage, may be applied as a drain voltage and a source voltage.

According to embodiments, to perform a programming operation using an FN tunneling method, a threshold voltage may be increased by applying voltage necessary to a cell transistor. According to embodiments, during a programming operation, a 7V select voltage Vsg may be applied to select gate 60, a 7V control voltage Vcn may be applied to control node 30, a 0V drain voltage Vdd may be applied to bit line 40, and a 0V source voltage Vss may be applied to source line 20. According to embodiments, voltage Vfloat of floating gate 200 may become approximately 5.6V. According to embodiments, voltage difference Vfloat-Vdd of approximately +5.6V may occur between a junction and may cause an FN tunneling phenomenon. According to embodiments, electrons e may flow into floating gate 200 through tunnel oxide film 202.

A programming operation using a hot electron injection method will be described, according to embodiments. Example FIG. 5 is a cross-sectional view of an EEPROM describing a programming method using a hot electron injection method, according to embodiments. Referring to example FIG. 5, P type well 220 may be formed in a semiconductor substrate and high concentration N+ impurity ion regions 230 and 250 may be formed in P type well 220. According to embodiments, tunnel oxide film 240 may be formed, and gates 200 and 210 may be formed on and/or over the top of tunnel oxide film 240. According to embodiments, floating gate FG 200 may correspond to floating gate 82 illustrated in example FIG. 2, and select gate SG 210 may correspond to select gate 60 illustrated in example FIG. 2.

According to embodiments, in a hot electron injection method for performing a programming operation, a drain voltage may be higher than a positive voltage applied to a control node. According to embodiments, a positive voltage higher than a drain voltage may be applied to select gate 210, and a reference voltage, for example, ground voltage, may be applied as source voltage, according to embodiments.

According to embodiments, during a programming operation, a 10V select voltage Vsg may be applied to select gate 210, a 3V control voltage Vcn may be applied to control node, a 5.5V drain voltage Vdd may be applied to drain region 230, and a 0V source voltage Vss may be applied to source region 250. According to embodiments, a transistor may be turned on and may allow current to flow through a channel. According to embodiments, some hot electrons that may be generated may be injected into floating gate 200, through gate oxide film 240, by an electric field formed vertically to a gate. According to embodiments, a threshold voltage of a cell transistor may increase from a previous voltage due to an injection of hot electrons.

Table 2 shows operation conditions of a single poly type EEPROM described above, according to embodiments.

TABLE 2

| Classification | Vcn | Vdd | Vsg | Vss |
| --- | --- | --- | --- | --- |
| Read | 3 | 1 | 5 | 0 |
| Erase | 0 | 7 | 7 | 0 |
| FN programming | 7 | 0 | 7 | 0 |
| HEI programming | 3 | 5.5 | 10 | 0 |

According to embodiments, read characteristics, erase characteristics, FN programming characteristics, and HEI programming characteristics may be checked through operation conditions shown in Table 2.

A method for manufacturing a single poly type EEPROM will be described with reference to example FIGS. 2 and 5, according to embodiments.

According to embodiments, device isolation film 50 may be formed on and/or over a device isolation region of a semiconductor substrate. According to embodiments, device isolation film may be formed by any method. According to embodiments, referring to example FIG. 5, a well may be formed in a semiconductor substrate. Device isolation film 50 may be formed by forming a trench on and/or over a semiconductor substrate and providing a dielectric material in the trench. According to embodiments, activation regions 20, 30 and 40 may be defined by device isolation film 50. According to embodiments, a dielectric layer such as an oxide film and a poly silicon layer may be formed on and/or over a top of the semiconductor substrate.

According to embodiments, dielectric layer and poly silicon layer may be patterned through photo and etching processes and may form a tunnel oxide film and various gates. According to embodiments, poly silicon layer may be patterned so that select gate 60 and floating gates 80 and 82 may be formed as shown in example FIG. 2. According to embodiments, floating gate 82 at a side of a control node 30 may be formed not to overlap with device isolation region 50, and may be formed to overlap with a top of activation region 30. According to embodiments, floating gate 82 at a side of a control node 30 may be formed to overlap with only a top of activation region 30.

According to embodiments, a single poly type EEPROM and a method for manufacturing an EEPROM may differ from a related art device and method. For example, according to the related art, a floating gate at a side of a control node may be formed to overlap with both a device isolation region and an activation region. According to embodiments, a floating gate of a control node side may be formed so as not to overlap with a device isolation region, but to overlap only with a top of an activation region. According to embodiments, a ratio of a capacitance of a control node side to a capacitance of a bit line side may increase. According to embodiments, a coupling ratio may be improved.

According to embodiments, a floating gate may be formed to have various shapes, such as a finger form. This may maximize a junction capacitance.

According to the related art, an N type impurity ion may be implanted into a bottom of a floating gate to increase a junction capacitance. This may increase a chip and may increase a complexity of a process. According to embodiments, however, junction capacitance may be improved by not doping the floating gate with an impurity. This may reduce a chip size by securing design margins.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A device, comprising:
 a semiconductor substrate including an activation region and a device isolation region, wherein the activation region includes a control node and a bit line formed in parallel in a bit line direction;
 a floating gate including a first region angled and overlapping with the control node in the bit line direction and a word line direction perpendicular to the bit line direction, and a second region overlapping with the bit line in the word line direction so that a first capacitor formed adjoining the first region is larger than a second capacitor formed adjoining the second region; and
 a select gate formed over the top of the activation region.

2. The device of claim 1, comprising a single poly type EEPROM, wherein the single poly type EEPROM is configured to perform a programming operation using a hot electron injection method.

3. The device of claim 2, wherein in the hot electron injection method, a drain voltage is higher than a positive voltage applied to the control node, a positive voltage higher than the drain voltage is applied to the select gate, and a reference voltage is applied as a source voltage.

4. The device of claim 1, comprising a single poly type EEPROM, wherein the single poly type EEPROM is configured to perform a programming operation using a Flower-Nordheim (FN) tunneling method.

5. The device of claim 4, wherein in the FN tunneling method, a same positive voltage is applied to the select gate and the control node, and a reference voltage is applied as a drain voltage and a source voltage.

6. The device of claim 1, comprising a single poly type EEPROM, wherein the single poly type EEPROM is configured to perform an erase operation using a Flower-Nordheim (FN) tunneling method.

7. The device of claim 1, wherein a distance that the floating gate is spaced from the device isolation region in the word line direction is substantially the same as a distance that the floating gate is spaced from the device isolation region in the bit line direction.

8. The device of claim 1, wherein the floating gate is spaced from the device isolation region by approximately 0.1 μm to 1.0 μm in the word line direction.

9. The device of claim 1, wherein the floating gate is paced from the device isolation region by approximately 0.1 μm to 1.0 μm in the bit line direction.

* * * * *